US009368460B2

(12) United States Patent
Yu et al.

(10) Patent No.: US 9,368,460 B2
(45) Date of Patent: Jun. 14, 2016

(54) FAN-OUT INTERCONNECT STRUCTURE AND METHOD FOR FORMING SAME

(71) Applicant: Taiwan Semiconductor Manufacturing Company, Ltd., Hsin-Chu (TW)

(72) Inventors: Chen-Hua Yu, Hsinchu (TW); Yen-Chang Hu, Tai-Chung (TW); Ching-Wen Hsiao, Hsinchu (TW); Mirng-Ji Lii, Sinpu Township (TW); Chung-Shi Liu, Hsinchu (TW); Chien Ling Hwang, Hsinchu (TW); Chih-Wei Lin, Xinfeng Township (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/937,726

(22) Filed: Jul. 9, 2013

(65) Prior Publication Data

US 2014/0264930 A1    Sep. 18, 2014

Related U.S. Application Data

(60) Provisional application No. 61/793,930, filed on Mar. 15, 2013.

(51) Int. Cl.
*H01L 23/00* (2006.01)
*H01L 21/56* (2006.01)
(Continued)

(52) U.S. Cl.
CPC .............. *H01L 24/05* (2013.01); *H01L 21/561* (2013.01); *H01L 23/293* (2013.01); *H01L 23/3185* (2013.01); *H01L 23/3192* (2013.01); *H01L 23/5389* (2013.01); *H01L 24/19* (2013.01); *H01L 24/96* (2013.01); *H01L 21/568* (2013.01); *H01L 23/525* (2013.01); *H01L 24/03* (2013.01); *H01L 24/13* (2013.01); *H01L 2224/0231* (2013.01); *H01L 2224/0235* (2013.01); *H01L 2224/02381* (2013.01); *H01L 2224/0401* (2013.01); *H01L 2224/04105* (2013.01);
(Continued)

(58) Field of Classification Search
CPC ................ H01L 2224/0231; H01L 2224/0239
USPC ............................ 257/100, 787–793; 438/127
See application file for complete search history.

(56) References Cited

U.S. PATENT DOCUMENTS

| 5,870,289 A | 2/1999 | Tokuda et al. | |
|---|---|---|---|
| 5,902,686 A * | 5/1999 | Mis ............................... | 428/629 |

(Continued)

FOREIGN PATENT DOCUMENTS

| JP | 2001521288 A | 11/2001 |
|---|---|---|
| KR | 20100047540 A | 5/2010 |
| KR | 20110077213 A | 7/2011 |

*Primary Examiner* — Matthew Reames
*Assistant Examiner* — Vincent Wall
(74) *Attorney, Agent, or Firm* — Slater Matsil, LLP

(57) ABSTRACT

A method embodiment includes forming a sacrificial film layer over a top surface of a die, the die having a contact pad at the top surface. The die is attached to a carrier, and a molding compound is formed over the die and the sacrificial film layer. The molding compound extends along sidewalls of the die. The sacrificial film layer is exposed. The contact pad is exposed by removing at least a portion of the sacrificial film layer. A first polymer layer is formed over the die, and a redistribution layer (RDL) is formed over the die and electrically connects to the contact pad.

20 Claims, 13 Drawing Sheets

(51) Int. Cl.
*H01L 23/538* (2006.01)
*H01L 23/29* (2006.01)
*H01L 23/31* (2006.01)
*H01L 23/525* (2006.01)

(52) U.S. Cl.
CPC ............ *H01L2224/05008* (2013.01); *H01L 2224/05016* (2013.01); *H01L 2224/05017* (2013.01); *H01L 2224/05022* (2013.01); *H01L 2224/05124* (2013.01); *H01L 2224/05144* (2013.01); *H01L 2224/05147* (2013.01); *H01L 2224/05567* (2013.01); *H01L 2224/05573* (2013.01); *H01L 2224/05647* (2013.01); *H01L 2224/05666* (2013.01); *H01L 2224/11002* (2013.01); *H01L 2224/12105* (2013.01); *H01L 2224/13007* (2013.01); *H01L 2224/13024* (2013.01); *H01L 2224/13111* (2013.01); *H01L 2224/1411* (2013.01); *H01L 2224/97* (2013.01); *H01L 2924/181* (2013.01); *H01L 2924/18162* (2013.01)

(56) References Cited

U.S. PATENT DOCUMENTS

| | | | |
|---|---|---|---|
| 6,168,992 B1 * | 1/2001 | Lee | H01L 27/10852 257/E21.019 |
| 6,433,427 B1 | 8/2002 | Wu et al. | |
| 6,515,369 B1 | 2/2003 | Lin | |
| 6,528,349 B1 | 3/2003 | Patel et al. | |
| 6,746,898 B2 | 6/2004 | Lin et al. | |
| 6,972,964 B2 | 12/2005 | Ho et al. | |
| 7,170,162 B2 | 1/2007 | Chang | |
| 7,276,783 B2 | 10/2007 | Goller et al. | |
| 7,368,374 B2 | 5/2008 | Chia et al. | |
| 7,397,000 B2 | 7/2008 | Shimoto et al. | |
| 7,485,956 B2 | 2/2009 | Tuckerman et al. | |
| 7,498,196 B2 | 3/2009 | Lee et al. | |
| 7,755,151 B2 | 7/2010 | Lim et al. | |
| 7,863,721 B2 | 1/2011 | Suthiwongsunthorn et al. | |
| 7,883,991 B1 * | 2/2011 | Wu et al. | 438/459 |
| 7,906,860 B2 | 3/2011 | Meyer et al. | |
| 8,003,512 B2 | 8/2011 | Belanger et al. | |
| 8,008,125 B2 | 8/2011 | McConnelee et al. | |
| 8,039,315 B2 | 10/2011 | Lee et al. | |
| 8,114,708 B2 | 2/2012 | McConnelee et al. | |
| 8,163,596 B2 * | 4/2012 | Kapusta et al. | 438/106 |
| 8,178,435 B2 | 5/2012 | Lin | |
| 8,187,965 B2 | 5/2012 | Lin et al. | |
| 8,216,881 B2 | 7/2012 | Beer et al. | |
| 8,258,624 B2 | 9/2012 | Beer et al. | |
| 8,373,272 B2 | 2/2013 | Liu et al. | |
| 8,580,614 B2 * | 11/2013 | Yu et al. | 438/110 |
| 2001/0011764 A1 | 8/2001 | Elenius et al. | |
| 2002/0064922 A1 | 5/2002 | Lin | |
| 2002/0093107 A1 | 7/2002 | Wu et al. | |
| 2003/0017647 A1 | 1/2003 | Kwon et al. | |
| 2003/0071326 A1 | 4/2003 | Lin | |
| 2003/0092274 A1 | 5/2003 | Brintzinger | |
| 2004/0232543 A1 | 11/2004 | Goller et al. | |
| 2007/0170577 A1 | 7/2007 | Dangelmaier et al. | |
| 2007/0236859 A1 | 10/2007 | Borland et al. | |
| 2007/0267743 A1 | 11/2007 | Mizusawa et al. | |
| 2007/0290379 A1 | 12/2007 | Dueber et al. | |
| 2007/0291440 A1 | 12/2007 | Dueber et al. | |
| 2008/0150121 A1 * | 6/2008 | Oganesian et al. | 257/692 |
| 2009/0020864 A1 | 1/2009 | Pu et al. | |
| 2009/0243081 A1 | 10/2009 | Kapusta et al. | |
| 2009/0289356 A1 | 11/2009 | Camacho et al. | |
| 2009/0309235 A1 | 12/2009 | Suthiwongsunthorn et al. | |
| 2010/0193949 A1 | 8/2010 | Belanger et al. | |
| 2010/0207265 A1 * | 8/2010 | Muthukumar et al. | 257/692 |
| 2011/0198762 A1 * | 8/2011 | Scanlan | 257/793 |
| 2012/0028411 A1 * | 2/2012 | Yu et al. | 438/107 |
| 2012/0043654 A1 | 2/2012 | Lu et al. | |
| 2012/0043655 A1 | 2/2012 | Khor et al. | |
| 2012/0103475 A1 | 5/2012 | Kim | |
| 2012/0119378 A1 * | 5/2012 | Ng et al. | 257/774 |

* cited by examiner

FAN-OUT INTERCONNECT STRUCTURE AND METHOD FOR FORMING SAME

This application claims the benefit of U.S. Provisional Application No. 61/793,930 filed on Mar. 15, 2013, entitled "Cost-Reducing Fan-Out Interconnect Structure," which application is hereby incorporated herein by reference.

BACKGROUND

A typical integrated circuit structure is made up of dies that include active devices such as transistors and capacitors. These devices are initially isolated from each other, and interconnect structures are later formed over the active devices to create functional circuits. On top of the interconnect structures, metal pads are formed and exposed on the surface of the respective die. Electrical connections are made through the metal pads to connect the die to a package substrate or another die.

In an aspect of conventional packaging technologies, such as fan-out packaging, redistribution layers (RDLs) may be formed over a die and electrically connected to the metal pads. Input/output (I/O) pads such as solder balls may then be formed to electrically connect to the metal pads through the RDLs. An advantageous feature of this packaging technology is the possibility of forming fan-out packages, which means the I/O pads on a die can be redistributed to a greater area than the die, and hence the number of I/O pads packed on the surfaces of the dies can be increased.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Various embodiments will be described with respect to a specific context, namely a fan-out packaging technology such as fan-out wafer level packaging (FO-WLP).

Figure 1:
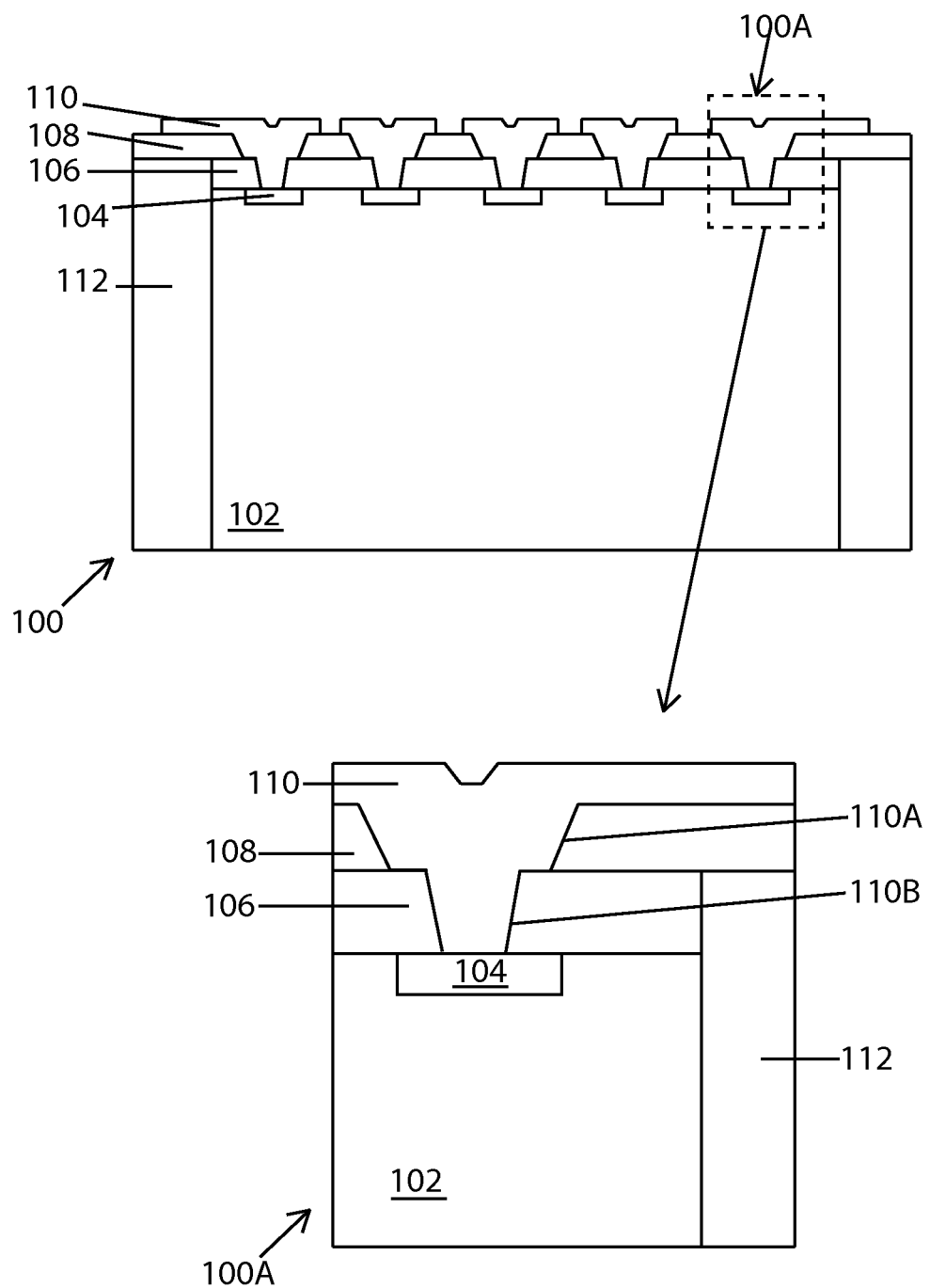
FIG. 1 is a cross-sectional view of an integrated circuit structure in accordance with various embodiments.

FIG. 1 is a cross-sectional view of a portion of an integrated circuit (IC) structure 100 in accordance with various embodiments. IC structure 100 includes a die 102 and a RDL 110 over die 102. Lateral portions of RDL 110 may extend beyond edges of die 102 and over molding compound 112. Therefore, the resulting IC structure 100 may be referred to as a fan-out package. Die 102 includes contact pads 104. RDL 110 is connected to devices (not shown) in die 102 through contact pads 104.

For the purpose of illustration, a portion of IC 100 has been magnified (100A) and is also shown in FIG. 1. Polymer layers 106 and 108 are formed over die 102. RDL 110 extends through both polymer layers 106 and 108 to contact contact pads 104. Notably, RDL 110 is directly connected to die 102 through contact pads 104, and IC structure 100 does not include an additional metallic pillar between RDL 110 and contact pads 104. RDL 110 may have sidewalls 110A and 110B. Sidewalls 110A and 120B may be sloped, and in some embodiments, sidewalls 110A and 110B may have a slope of about 30 to about 88.5 degrees. The appropriate angle for 110A and 110B may depend on layout design of RDLs 110. For example, selecting an angle closer to 88.5 degrees for sidewalls 110A and 110B allows for a fine pitch design and allow for a greater number of interconnect structures in polymer layer 106 and 108. By eliminating the need for a metallic pillar between RDL 110 and contact pads 104, the manufacturing cost of IC 100 may be reduced.

Figure 2A:
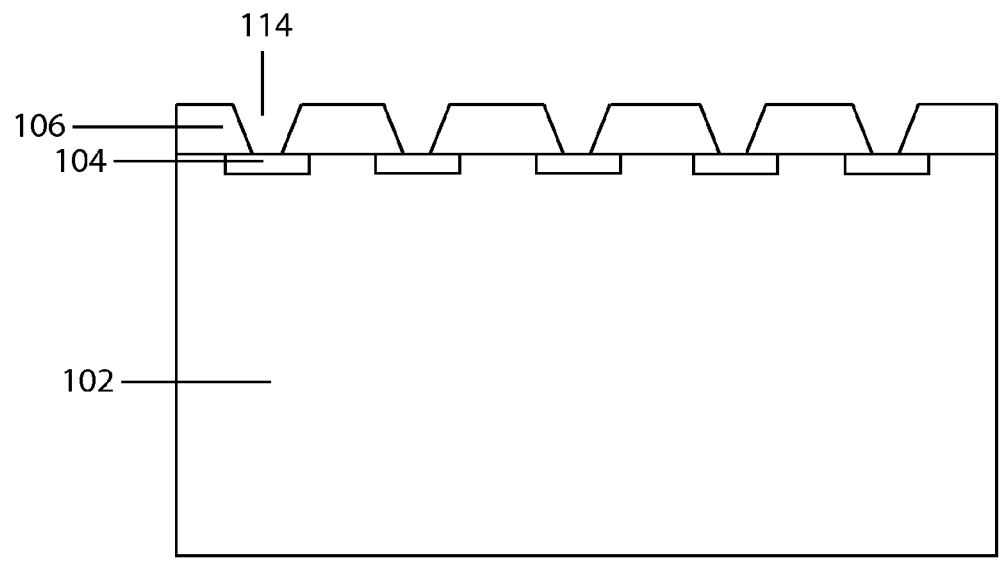
FIGS. 2A-2I are cross-sectional views of intermediate stages of manufacture of an integrated circuit structure in accordance with various embodiments.

FIGS. 2A-2I are cross-sectional views of intermediate stages of manufacture of IC structures (e.g., IC structure 100) in accordance with various embodiments. FIG. 2A illustrates a cross-sectional view of die 102, which may include a substrate, active devices, and an interconnect structure (not shown). The substrate may be a bulk silicon substrate although other semiconductor materials including group III, group IV, and group V elements may also be used. Active devices such as transistors may be formed on the top surface of the substrate. An interconnect structure may be formed over the active devices and the substrate.

The interconnect structure may include an inter-layer dielectric (ILD) formed over the substrate, and various intermetal dielectric layers (IMDs) are formed over the ILD. The ILD and IMDs may be formed of low-k dielectric materials having k values, for example, lower than about 4.0. The ILD and IMDs may be made of, for example, silicon oxide, SiCOH, and the like.

Contact pads 104 are formed over the interconnect structure and may be electrically coupled to the active devices through various metallic lines and vias in the interconnect structure. Contact pads 104 may be made of a metallic material and may also be referred to as metal pads. Contact pads 104 may be aluminum pads, although other metallic materials may also be used. Furthermore, a passivation layer (not shown) may be formed over the interconnect structure and contact pads 104 and may be formed of non-organic materials such as silicon oxide, un-doped silicate glass, silicon oxynitride, and the like. Contact pads 104 may have a lateral width of about 10 to about 100 μm. Openings may be formed in portions of the passivation layer that cover contact pads 104, exposing portions of contact pads 104. Portions of the passivation layer may also cover edge portions of contact pads 104. The various features of die 102 may be formed by any suitable method and are not described in further detail herein. Although FIG. 2A shows a single die 102, various embodiments may also be applied to a wafer having multiple dies.

Figure 5A:
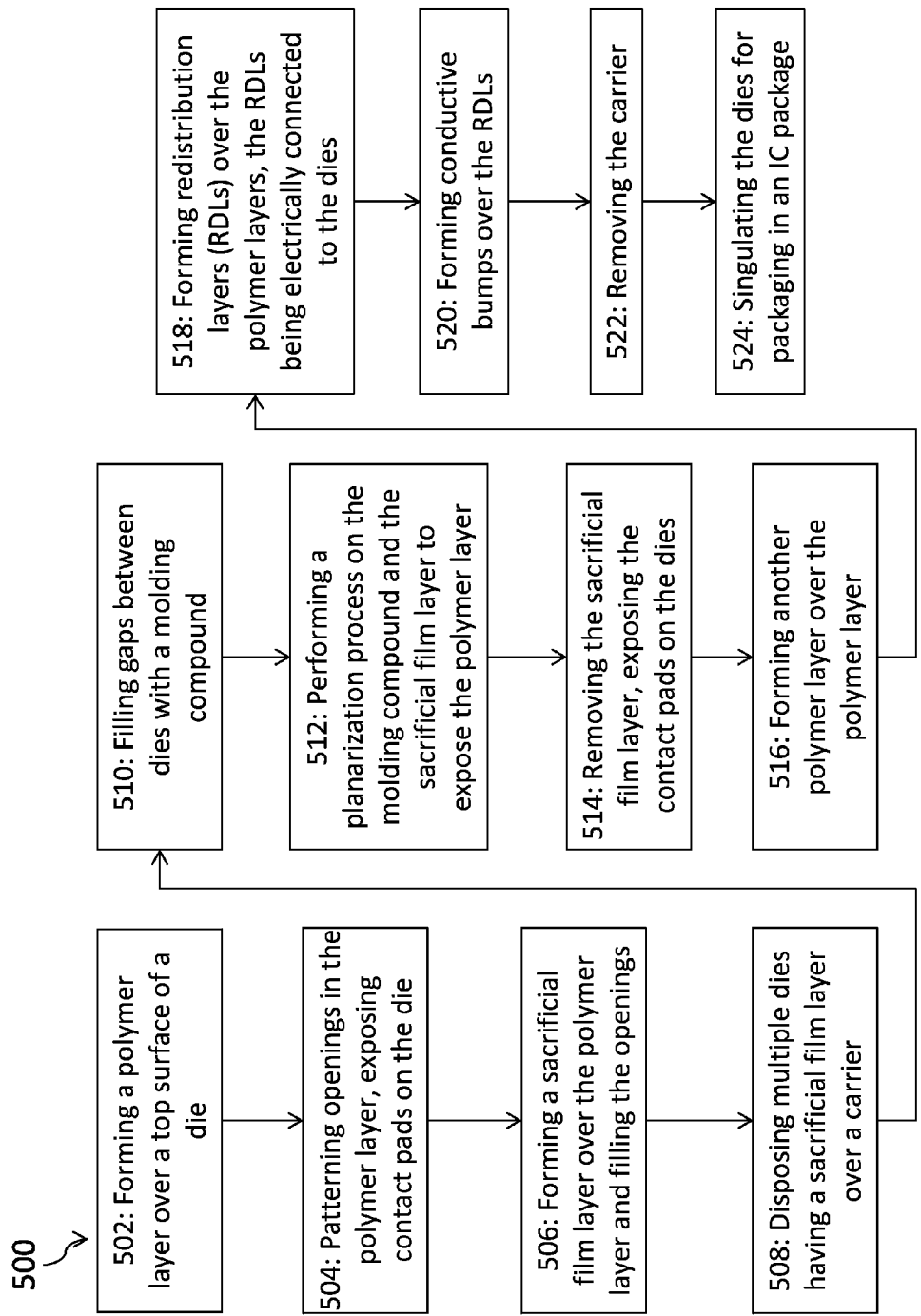
FIGS. 5A-5B illustrate process flows for forming integrated circuit structures in accordance with various embodiments.

FIG. 2A also illustrates the formation of polymer layer 106 over a top surface of die 102 (see step 502 of process 500 in FIG. 5A). Polymer layer 106 may be formed of a material such as polyimide (PI), polybenzoxazole (PBO), benzocyclobuten (BCB), epoxy, silicone, acrylates, nano-filled pheno resin, siloxane, fluorinated polymer, polynorbornene, and the like. Polymer layer 106 may be formed using, for example, spin on coating techniques. Polymer layer 106 may have a thickness of less than about 20 µm. Polymer layer 106 is patterned using, for example, a combination of photolithographic techniques and etching (see step 504 of process 500 in FIG 5A). The patterning of polymer layer 106 creates openings 114 exposing portions of contact pads 104.

Figure 2B:
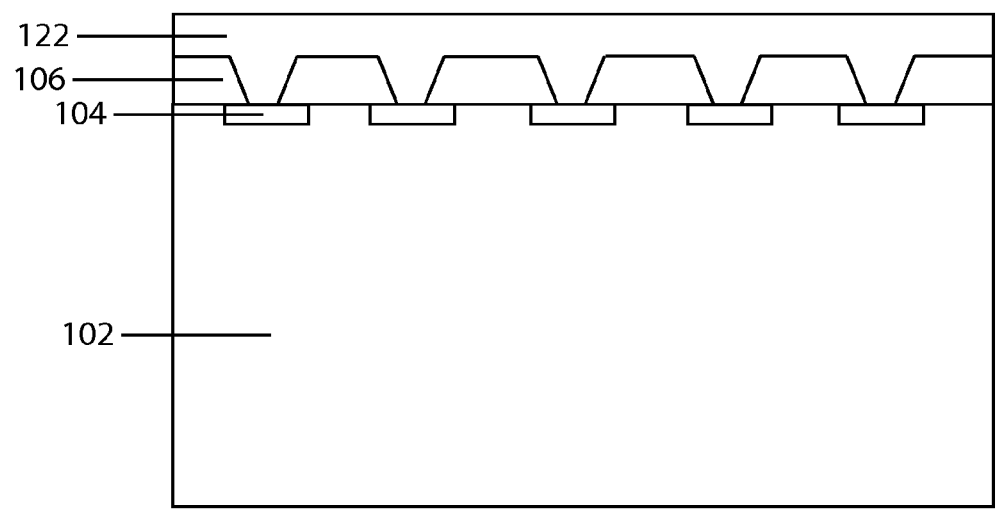

FIG. 2B illustrates the formation of a sacrificial film layer 122 over polymer layer 106 and filling openings 114 (see FIG. 2A, see also step 506 of process 500 in FIG. 5A). Sacrificial film layer 122 may be formed of a dielectric material such as a polymer, a polymer based photoresist, or a polyimide based photoresist. Sacrificial film layer 122 may be deposited using an appropriate technique such as spin-on coating, or the like. Furthermore, after sacrificial film layer 122 is deposited, it may be cured at an appropriate temperature. Alternatively, sacrificial film layer 122 may be a laminated film. For example, sacrificial film layer 122 may be a base film attached to dies 102 using an adhesive layer. The base film may be, for example, a polyethylene terephthalate (PET) base film, and the adhesive layer may be, for example, an ultraviolet (UV) or thermal activated release film.

Figure 2C:
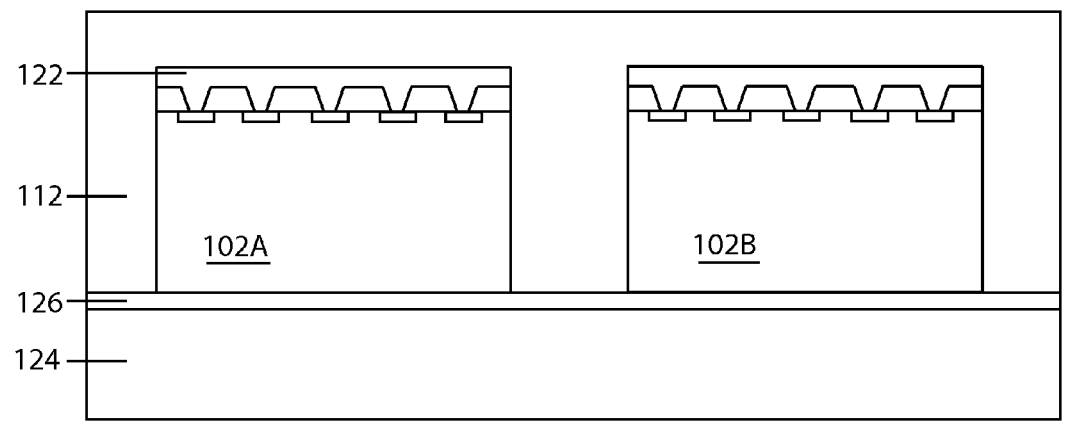

In FIG. 2C, multiple dies 102 (e.g., die 102A and die 102B) having sacrificial film layers 122 may be disposed over a carrier 124 (see step 508 of process 500 in FIG. 5A). Carrier 124 may be made of a suitable material, for example, glass. Bottom surfaces of dies 102A and 102B may be affixed to carrier 124 using an adhesive layer 126 as an interface. Adhesive layer 126 may be formed of a temporary adhesive material such as ultraviolet (UV) tape, wax, glue, or the like. Furthermore, a die attach film (DAF) may optionally be formed under dies 102 (not shown) prior to their placement on carrier 124. The DAF allows for improved adhesion between dies 102 and carrier 124.

Molding compound 112 may be used fill gaps between dies 102 (e.g., dies 102A and 102B; see step 510 of process 500 in FIG. 5A). Molding compound 112 may be any suitable material such as an epoxy resin, a molding underfill, or the like. Suitable methods for forming molding compound 112 may include compressive molding, transfer molding, liquid encapsulent molding, or the like. For example, molding compound 112 which may be dispensed between dies 102A and 102B in liquid form. Subsequently, a curing process is performed to solidify molding compound 112. The filling of molding compound 112 may overflow over dies 102 so that molding compound 112 covers a top surface of dies 102A and 102B.

Figure 2D:
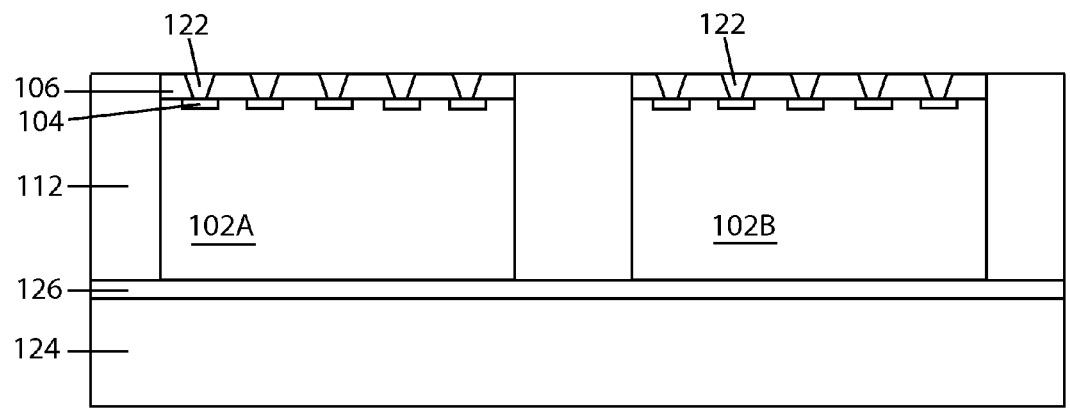

In FIG. 2D, a planarization process, such as a grinding process (e.g., a chemical-mechanical polish (CMP) or mechanical grinding) may be performed on molding compound 112 and sacrificial film layer 122 to expose polymer layer 106 (see step 512 of process 500 in FIG. 5A). As part of grinding process, upper portions of polymer layer 106 may also be removed to achieve a desired thickness. After the grinding process, polymer layer 106 may have a thickness of, for example, about 5 µm to about 15 µm. Polymer layer 106 and remaining portions of sacrificial film layer 122 act as a shield for contact pads 104 and dies 102 during the grinding process in lieu of a metallic pillar, reducing manufacturing costs.

Figure 2E:
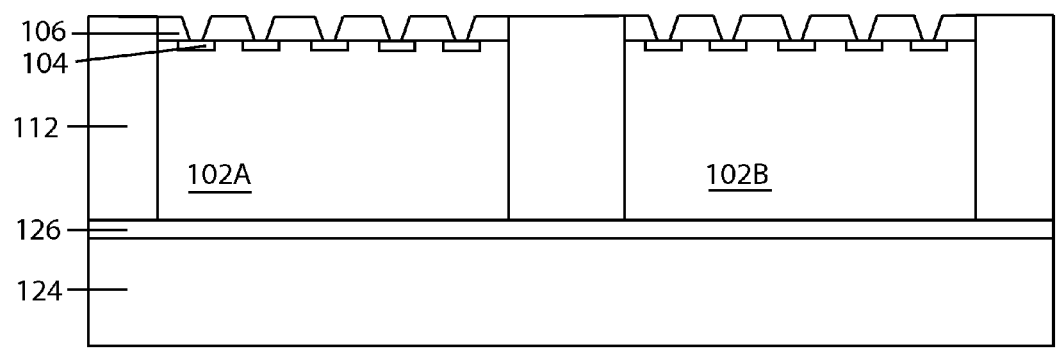

In FIG. 2E, sacrificial film layer 122 are removed from dies 102A and 102B, exposing contact pads 104 through polymer layer 106 (see step 514 of process 500 in FIG. 5A). The removal of sacrificial film layer 122 may include an etching process (e.g., a wet etch) that selectively removes the material of sacrificial film layer without significantly removing the materials of polymer layer 106 or dies 102A and 102B. This may be done by selecting an appropriate stripping chemical for the etching such as an alkaline based chemical. In an embodiment in which polymer layer 106 is formed of PBO and sacrificial film layer 122 is formed of a polymer/polyimide based photoresist, sacrificial film layer 122 may be removed using potassium hydroxide (KOH)), n-methylpyrrolidone (NMP), or the like as a stripping chemical.

Figure 2F:
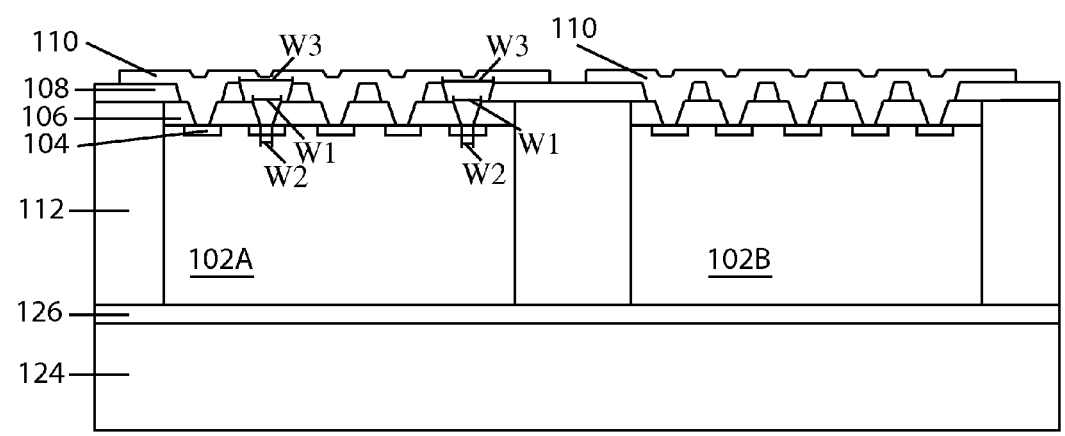

In FIG. 2F, a second polymer layer 108 is formed over polymer layer 106 (see step 516 of process 500 in FIG. 5A). Polymer layer 108 may be substantially similar to polymer layer 106, and polymer layer 108 may have a thickness over polymer layer 106 of less than about 20 µm. Furthermore, the formation of polymer layer 108 may fill openings in polymer layer 106 (i.e., openings 114). Afterwards, polymer layers 108 and 106 may be subsequently patterned or re-patterned (e.g., through photolithography and etching) to expose contact pads 104 through a plurality of openings (not shown). The patterning of polymer layers 106 and 108 may be done using the same photolithography and etching process. However, the portions of openings in polymer layer 108 may be wider than portions of openings in polymer layer 106. This may be achieved, for example, by controlling various conditions (e.g., depth of focus, exposure energy, or the like) of the photolithography and etching process.

RDLs 110 are formed over dies 102A and 102B, respectively. RDLs 110 may be electrically connected to the various devices in dies 102A and 102B through contact pads 104 (see step 518 of process 500 in FIG. 5A). RDLs 110 may be formed of copper or a copper alloy although other metals such as aluminum, gold, or the like may also be used. RDLs 110 may be formed in the same process step using any suitable method. For example, the formation of RDLs 110 may involve a seed layer and using a mask layer to define the shape of RDLs 110. A via portion of RDLs 110 in polymer layer 106 may have a lateral width W1 at the top surface of polymer layer 106 of between about 10 µm to about 110 µm depending on the lateral width W2 of the portion of the via contacting a metal pad 104. That is, a via portion of RDLs 110 at the top surface of polymer layer 106 may be slightly wider in the lateral dimension than width W2. Similarly, a portion of RDLs 110 in polymer layer 108 may have a lateral width (denoted by W3) of between about 12 µm to about 120 µm depending on W1 and W2. That is, the portion of RLDs 110 in polymer layer 108 may be slightly wider in the lateral dimension than widths W1 and W2. Therefore, the contact surface area of metal pad 104 may be redistributed to a wider surface area using RDLs 110.

Notably, RDLs 110 are connected to contact pads 104 without the use of an additional metallic pillar or via between RDL 110 and contact pads 104. Although only one RDL 110 is shown over each die 102, in alternative embodiments, multiple RDLs may be formed over and be interconnected to RDL 110.

Figure 2G:
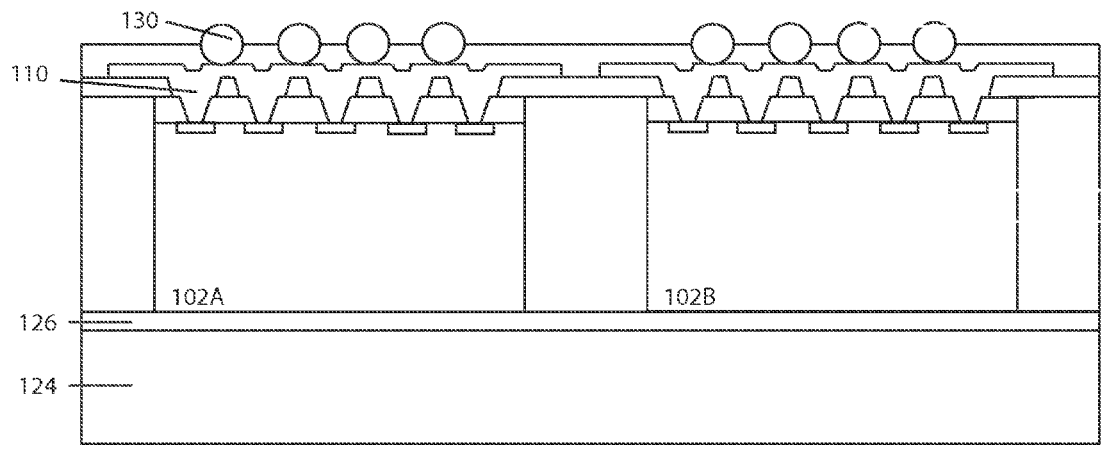

FIG. 2G illustrates the formation of conductive bumps 130 over RDLs 110 (see step 520 of process 500 in FIG. 5A). Conductive bumps 130 may be formed over under bump metallurgies (UBMs) (not shown) electrically connected to portions of RDLs 110. The UBMs may be formed of conductive materials such as copper, copper alloys, titanium, titanium alloys, or the like. Conductive bumps 130 may be reflowable bumps such as solder balls, which may include Sn—Ag, Sn—Cu, Sn—Ag—Cu, or the like. Alternatively conductive bumps 130 may be non-reflowable bumps such as copper bumps, and the like. Conductive bumps 130 are formed to electrically connect and bond other package components such as a wafer, a device die, an interposer, a printed circuit board (PCB), and the like to dies 102.

Figure 2H:
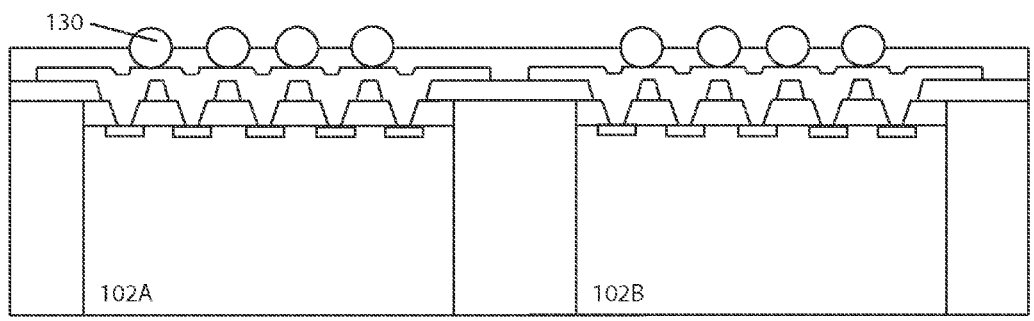
Figure 2I:
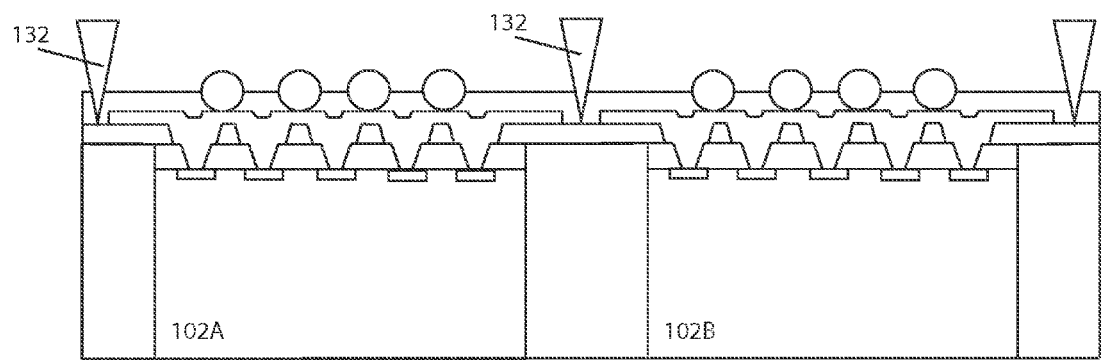

In FIG. 2H, carrier 124 and adhesive layer 126 are removed from dies 102A and 102B (see step 522 of process 500 in FIG. 5A). In an embodiment in which adhesive layer 126 is formed of UV tape, dies 102A and 102B may be removed by exposing adhesive layer 126 to UV light. In FIG. 2I, dies 102A and 102B may be singulated for packaging an IC package (see step 524 of process 500 in FIG. 5A). The singuation of dies 102A and 102 may include the use of a suitable pick-and-place tool such as pick-and-place tool 132. In a top down view (not shown) of dies 102 molding compound 112 may contact the sidewalls of and encircle die 102.

Figure 3A:
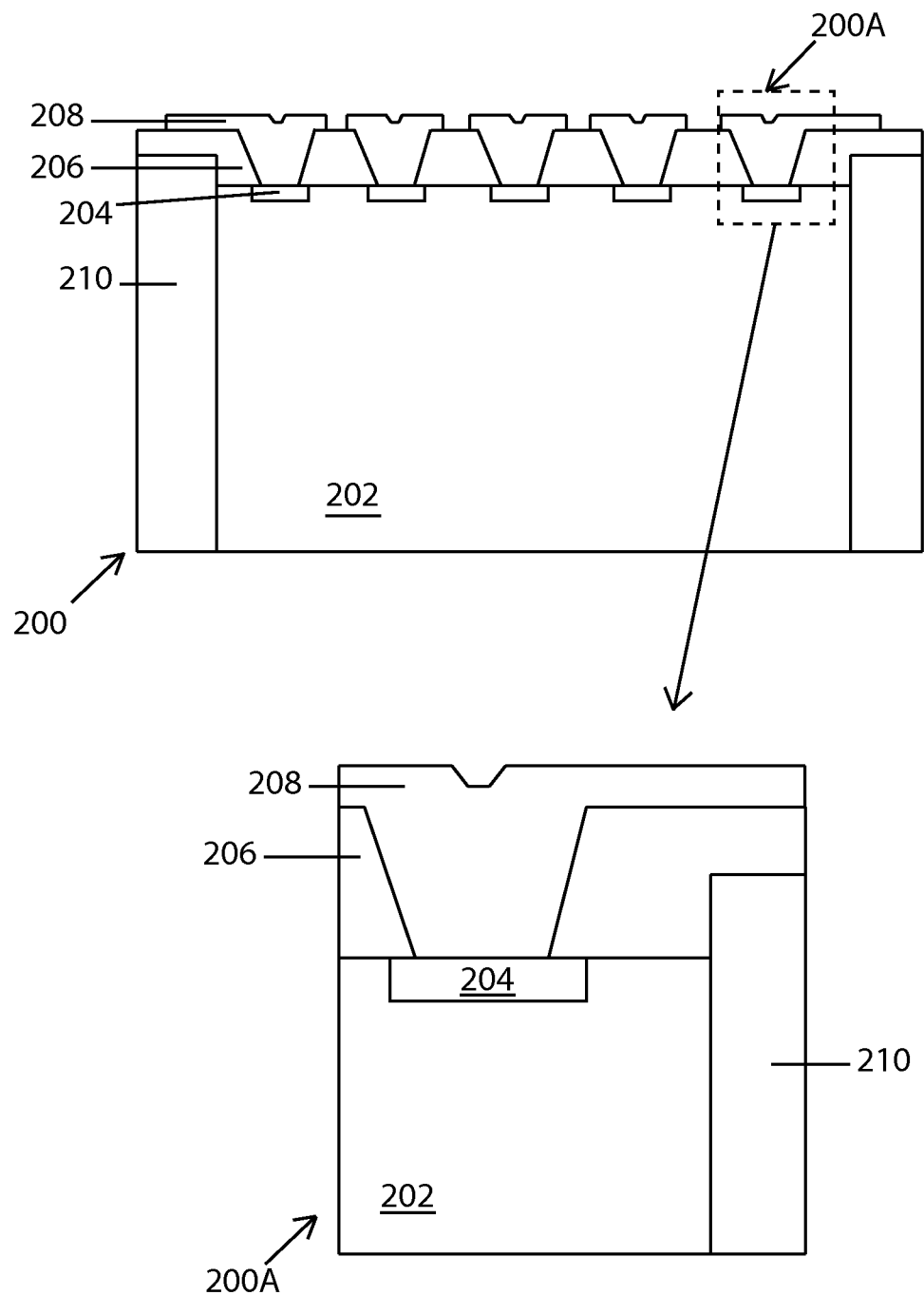
FIGS. 3A and 3B are cross-sectional views of an integrated circuit structure in accordance with various alternative embodiments.
Figure 3B:
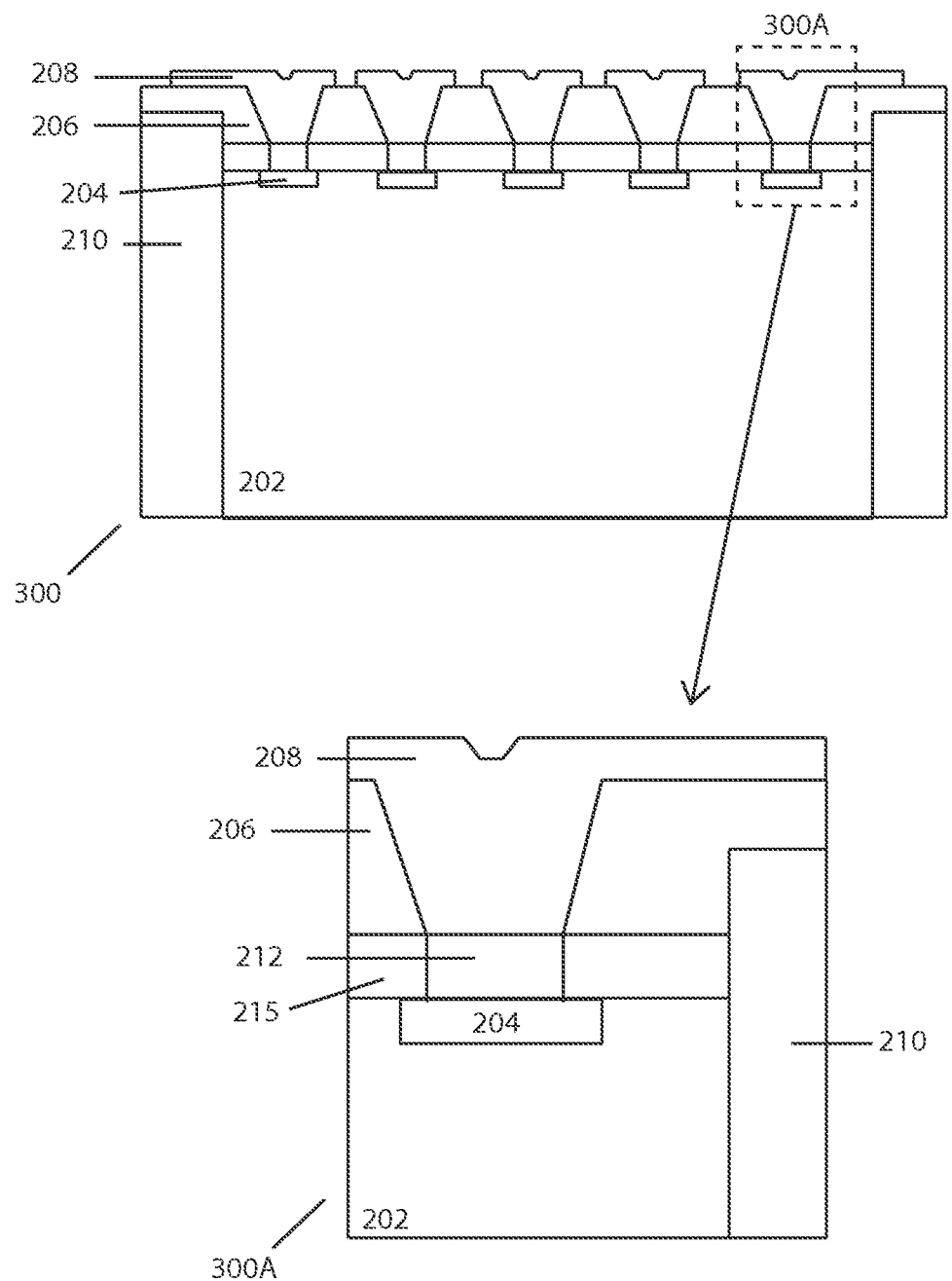

FIGS. 3A and 3B illustrate cross-sectional views of IC structures 200 (FIG. 3A) and 300 (FIG. 3B) in accordance with alternative embodiments. IC structures 200 and 300 include a die 202 having metal pads 204 and a RDL 208 over die 202 connected to metal pads 204. Lateral portions of RDL 208 may extend beyond die 202 and over molding compound 210 to form a fan-out packaging. Die 202 may (as shown in FIG. 3B) or may out (as shown in FIG. 3A) include a polymer layer 215 having a metallic pillar 212 over and connected to metal pads 204. Metallic pillar 212 may be a copper pillar, although other metals such as aluminum, gold, or the like may also be used. Polymer layer 215 may be substantially similar to polymer layers 106 and 108 (see FIG. 1).

For the purpose of illustration, a portion of IC 200 and 300 have been magnified (200A and 300A, respectively) and is also shown in FIGS. 3A and 3B. A polymer layer 206 includes a first portion over molding compound 210 and a second portion extending past a top surface of molding compound 210. RDL 208 may extend through polymer layer 206 and be electrically connected to metal pads 204. RDL 208 may be directly connected to metal pads 204 (shown in FIG. 3A) or be connected to metal pads 204 through metallic pillars 212 in a polymer layer 215 (shown in FIG. 3B). Notably, the top surface of die 202 is recessed from a top surface of molding compound. Furthermore, an edge of molding compound 210 over die 202 may be substantially perpendicular and may have an angle of between about 85° to 95°. This recessed and perpendicular interface allows for improved adhesion between polymer layer 206 and die 202.

Figure 4A:
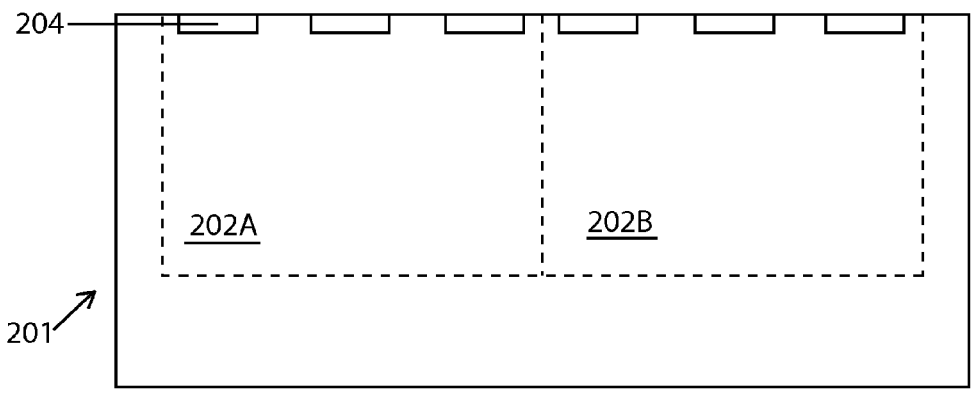
FIGS. 4A-4H are cross-sectional views of intermediate stages of manufacture of an integrated circuit structure in accordance with various alternative embodiments.

FIGS. 4A-4H illustrate cross-sectional views of intermediate stages of manufacture of an IC structure in accordance with various alternative embodiments. In FIG. 4A, various dies 202 (labeled as 202A and 202B) are provided in a wafer 201 (see step 602 of process 600 in FIG. 5B). Dies 202 include contact pads 204, which may formed of a metallic material (thus, contact pads 204 are referred to as metal pads 204 hereinafter) and be used to connect to various devices (not shown) in dies 202. Dies 202 may be substantially similar to dies 102 in FIGS. 1 and 2A-2I. Alternatively, dies 202 may also include a top polymer layer having metallic pillars (not shown) connected to metal pads 204. Although FIG. 4A shows a wafer 201, various embodiments may also be applied to single dies.

Figure 4B:
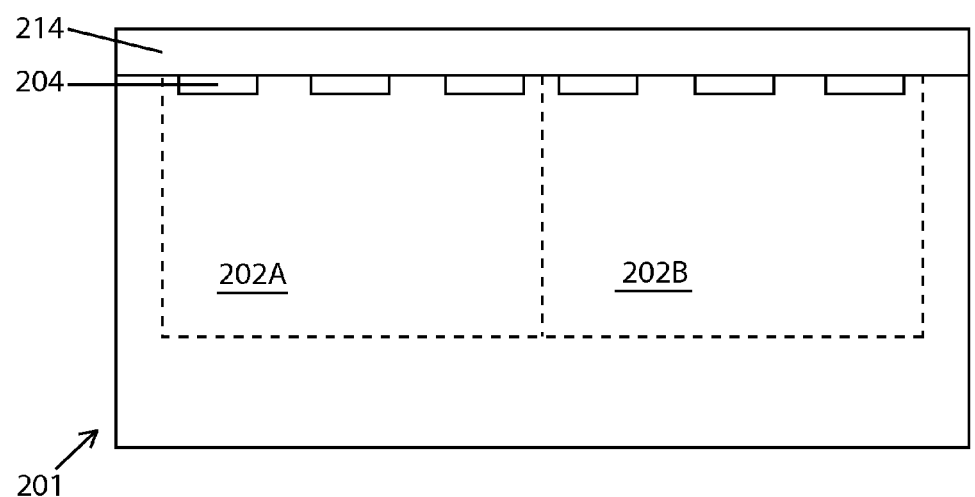
Figure 5B:
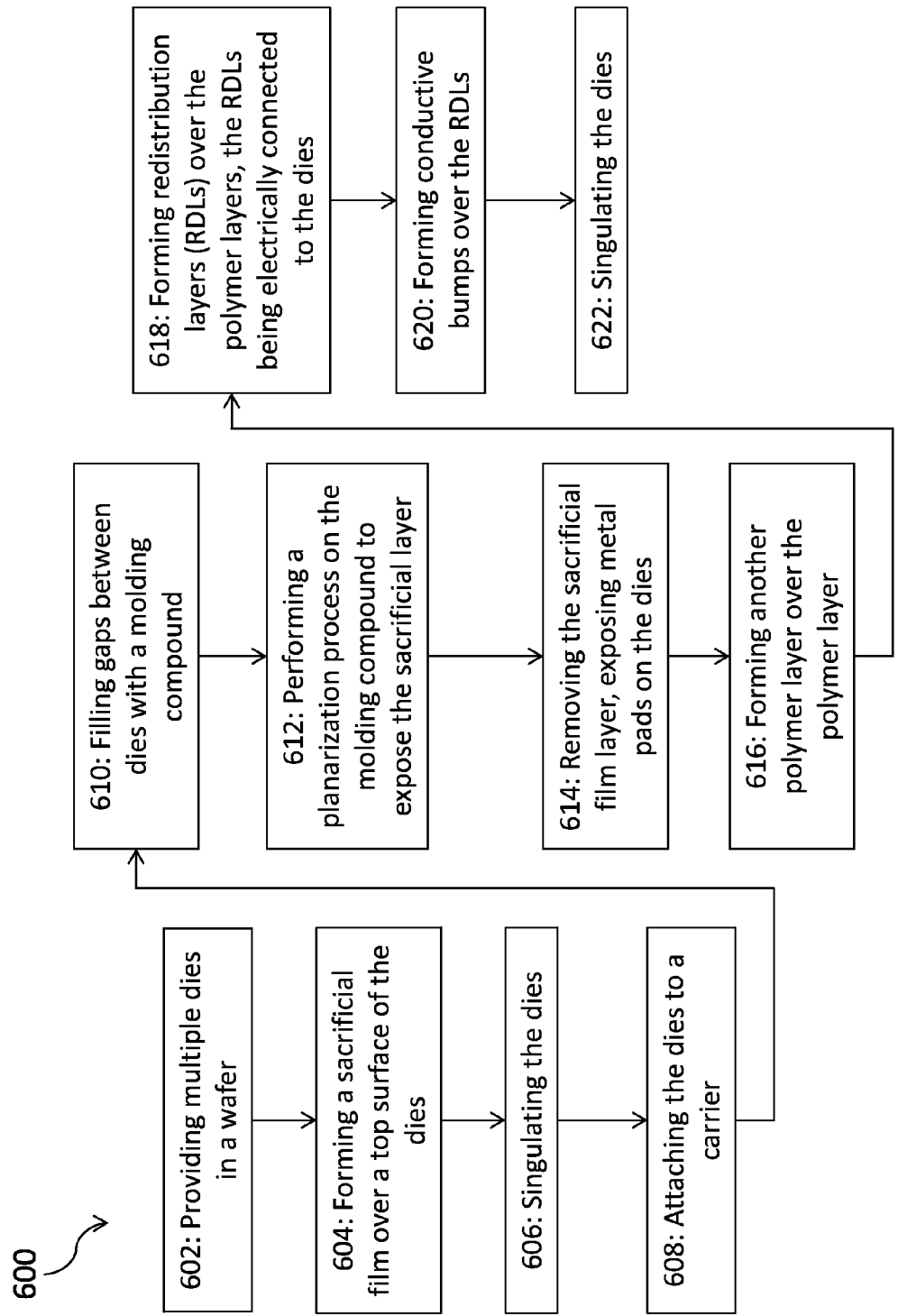

In FIG. 4B, a sacrificial film layer 214 is formed over a top surface of dies 202 (see step 604 of process 600 in FIG. 5B). Sacrificial film layer 214 may be substantially similar to sacrificial film layer 122. That is, sacrificial film layer 214 may be a polymer or polyimide based photoresist formed using, for example, spin-on coating techniques. Alternatively, sacrificial film layer 214 may be a laminated film such as a PET base film attached to dies 202 using an adhesive layer (e.g., UV or thermal activated release film).

Figure 4C:
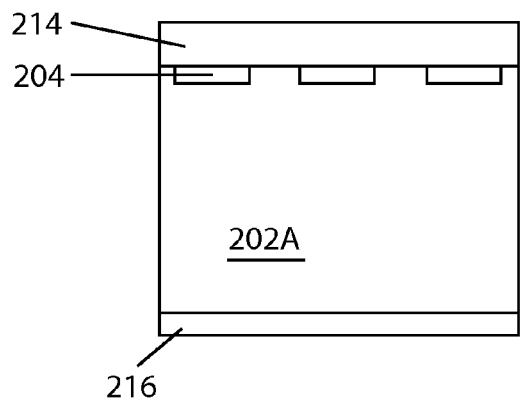

In FIG. 4C, dies 202 may be singulated (see step 606 of process 600 in FIG 5B). For example, FIG. 4C illustrates die 202A being separated from die 202B. Additionally, a die attach film (DAF) 216 may optionally be formed under bottom surfaces of dies 202.

Figure 4D:
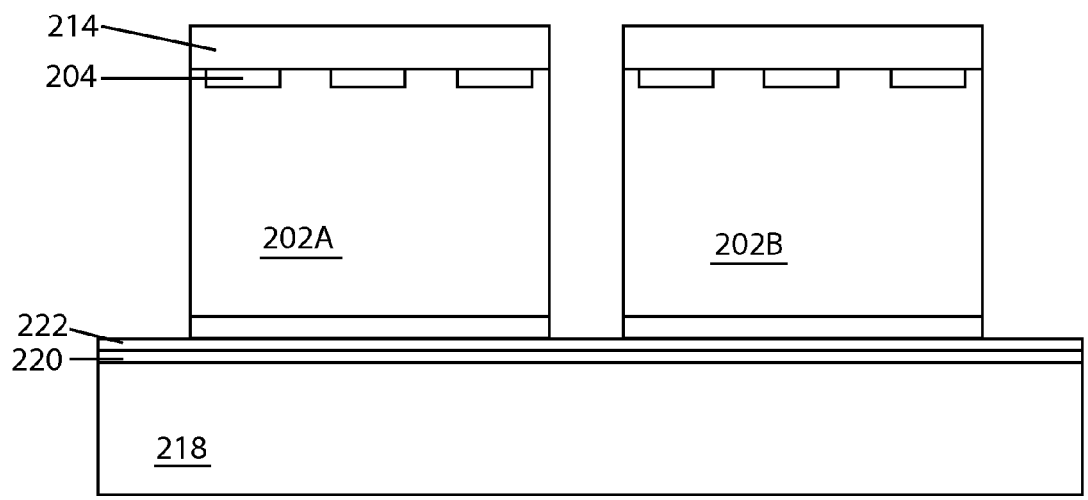

In FIG. 4D, bottom surfaces of dies 202A and 202B may be attached to a carrier 218 (see step 608 of process 600 in FIG. 5B) using an adhesive layer 220 (e.g., a light-to-heat-conversion release (LTHC) layer, a glue layer, or the like). Furthermore, a polymer layer 222 may be formed over carrier 218 so that dies 202 may be properly aligned with carrier 218.

Figure 4E:
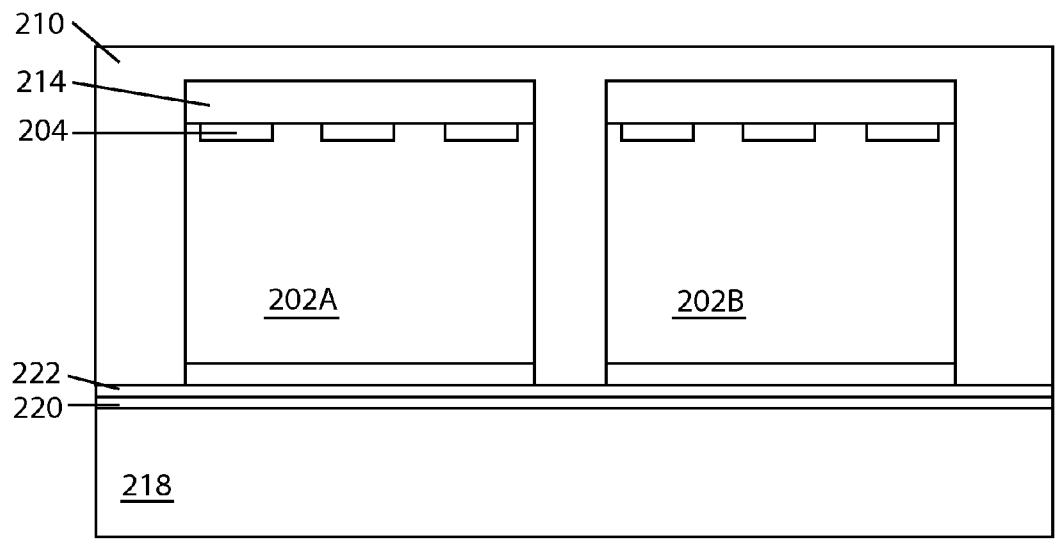

In FIG. 4E, a molding compound 210 may be used fill gaps between dies 202 (see step 610 of process 600 in FIG. 5B. Molding compound 210 may be any suitable material such as an epoxy resin, a molding underfill, or the like. Suitable methods for forming molding compound 210 may include compressive molding, transfer molding, liquid encapsulent molding, or the like. For example, molding compound 210 which may be dispensed between dies 202 in liquid form. Subsequently, a curing process is performed to solidify molding compound 210. The filling of molding compound 210 may overflow dies 202 so that molding compound 210 covers a top surface of dies 202.

Figure 4F:
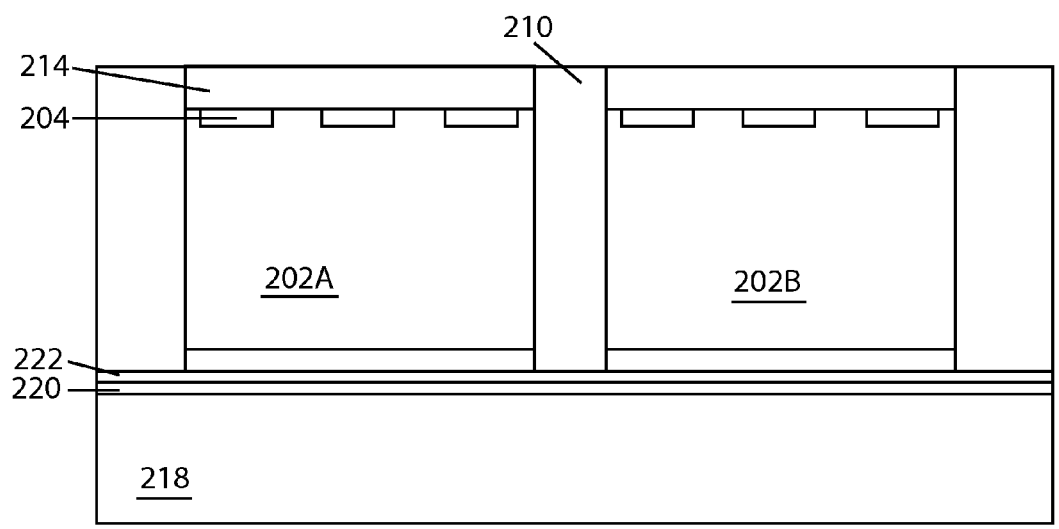

In FIG. 4F, a grinding process (e.g., a CMP or etch-back technique) may be employed to remove excess portions of molding compound 210 so that its top surface is level with top surfaces of sacrificial film layer 213 (see step 612 of process 600 in FIG. 5B). The grinding may also remove portions of sacrificial film layer 214 to a desired thickness. Sacrificial film layer 214 acts as a protection layer for dies 202 during the grinding of molding compound 210.

Figure 4G:
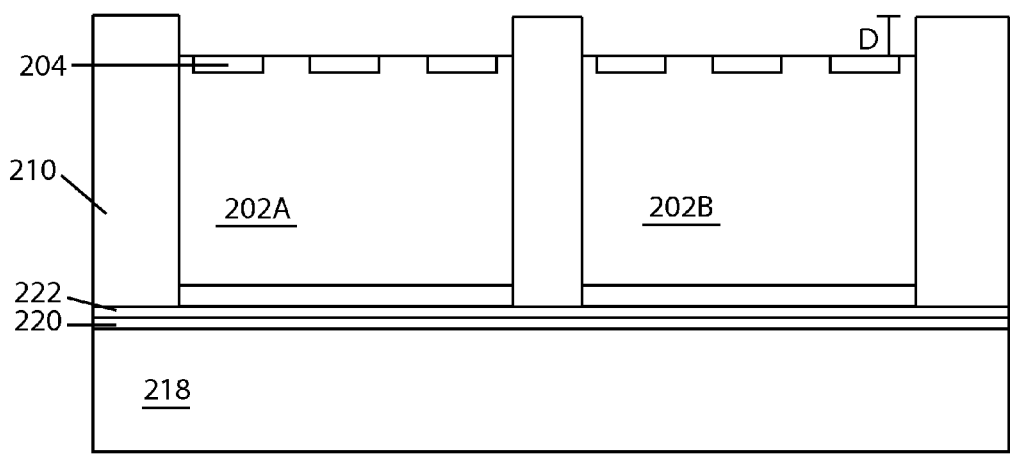

In FIG. 4G, sacrificial film layer 214 is removed, exposing metal pads 204 (see step 614 of process 600 in FIG. 5B). The method of removing sacrificial film layer 214 may depend on its composition. For example, if sacrificial film layer 214 is a coated layer, such as a photoresist, then a wet etch technique may be used to selectively remove sacrificial film layer 214 by choosing an appropriate etch chemical (e.g., KOH). If sacrificial film layer 214 is a laminated layer, such as a base film over an adhesive layer, then sacrificial film layer 214 may be removed by releasing the adhesive layer. This may be achieved by for example, exposing the adhesive layer to an appropriate environment such as hot air, a hot plate, an infrared lamp, UV light, or the like.

As shown in FIG. 4G, a top surface of dies 202 are recessed from a top surface of molding compound 210 by a distance D. Distance D may be greater than about 0.1 μm or even greater than about 1 μm. The dimensions of distance D may depend on the composition of sacrificial film layer 214. For example, if sacrificial film layer 214 is a coated layer, distance D may be less than about 20 μm. In an alternative example, if sacrificial film layer 214 is a laminated layer, distance D may be less than about 120 μm. Furthermore, the shape of edges of molding compound 210 over dies 202 may be substantially perpendicular. That is, sidewalls of molding compound 210 adjacent to and over dies 202 may have a slope of about 85 to 95 degrees.

Figure 4H:
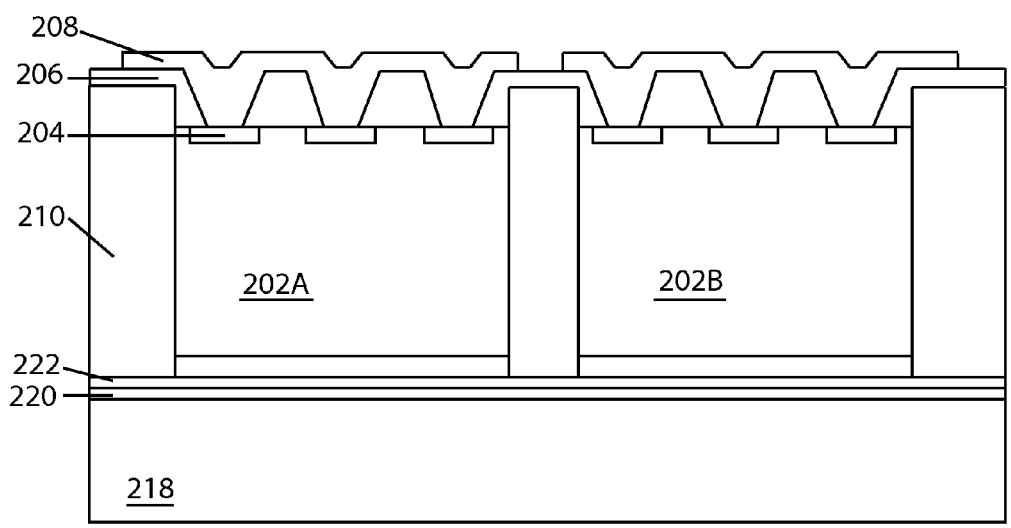

In FIG. 4H, a polymer layer 206 and RDLs 208 may be formed over molding compound 210 to electrically connect directly to metal pads 204 (see steps 616 and 618 of process 600 in FIG. 5B). Polymer layer 206 and RDLs 208 may be substantially similar to polymer layer 108 and RDL 110 respectively (see FIG. 2F). Although only one RDL 208 is shown over each die 202, in alternative embodiments, multiple RDLs may be formed over and be interconnected to RDL 208. Subsequently, conductive bumps, such as bond balls, (not shown) may be formed over RDL 208 (see step 620 of process 600 in FIG. 5B), and dies 202 may be singulated 622 (see step 614 of process 600 in FIG. 5B).

In accordance with an embodiment, a method for integrated circuit packaging includes forming a sacrificial film layer over a top surface of a die, the die having a contact pad at the top surface. The die is attached to a carrier, and a molding compound is formed over the die and the sacrificial film layer. The molding compound extends along sidewalls of the die. The sacrificial film layer is exposed. The contact pad is exposed by removing at least a portion of the sacrificial film layer. A first polymer layer is formed over the die, and a redistribution layer (RDL) is formed over the die and electrically connects to the contact pad.

In accordance with another embodiment, an integrated circuit structure includes a die comprising a substrate, an interconnect structure over the substrate, and a contact pad over the interconnect structure. A molding compound surrounds sidewalls of the die. A top surface of the molding compound is higher than a top surface of the die. The IC structure further includes a redistribution layer (RDL) over the die. The RDL comprises a continuous via structure directly connected to the contact pad. The continuous via structure is formed of a conductive material.

In accordance with yet another embodiment, an integrated circuit (IC) structure includes a die comprising a contact pad and a molding compound surrounding sidewalls of the die. The die has a top surface lower than a top surface of the molding compound. The IC structure further includes a redistribution layer (RDL) over the die. The RDL comprises a via connected to the metal pad, and wherein the via has an upper portion higher than the molding compound and a lower portion extending lower than a top surface of the molding compound.

Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for integrated circuit packaging comprising:
   forming a first polymer layer over a top surface of a die, the die having a contact pad at the top surface, wherein the first polymer layer is patterned to comprise a first opening exposing the contact pad;
   forming a sacrificial film layer over the first polymer layer, wherein the sacrificial film layer fills the first opening;
   attaching the die to a carrier;
   forming a molding compound over the die, the first polymer layer, and the sacrificial film layer, wherein the sacrificial film layer is disposed between the molding compound and the die, and wherein the molding compound extends along sidewalls of the die and covers a top surface of the sacrificial film layer;
   exposing the first polymer layer, wherein exposing the first polymer layer comprises removing an upper portion of the sacrificial film layer so that top surfaces of the sacrificial film layer is substantially level with a top surface of the first polymer layer;
   exposing the contact pad by removing remaining portions of the sacrificial film layer;
   forming a second polymer layer over the first polymer layer;
   patterning a second opening through the second polymer layer, wherein the second opening exposes a top surface of the first polymer layer, the first opening, and the contact pad; and
   forming a redistribution layer (RDL) over the die and electrically connected to the contact pad, wherein the RDL extends through the second opening.

2. The method of claim 1, wherein patterning the second opening comprises patterning the second polymer layer and re-patterning the first polymer layer using a same patterning process, and wherein forming the RDL comprises filling the second opening with a metallic material to electrically connect to the contact pad.

3. The method of claim 1, wherein exposing the first polymer layer comprises grinding the upper portions of the sacrificial film layer.

4. The method of claim 1, further comprising forming a third polymer layer between the die and the first polymer layer, wherein the third polymer layer comprises a conductive pillar electrically connecting the RDL to the contact pad.

5. The method of claim 1, wherein forming the RDL comprises forming a conductive via extending through the first polymer layer.

6. The method of claim 1, wherein forming the sacrificial film layer comprises using a polymer, a polymer based photoresist, or a polyimide based photoresist.

7. The method of claim 1, wherein removing the remaining portions of the sacrificial film layer comprises using an alkaline-based chemical or n-methylpyrrolidone (NMP) as a strip chemical.

8. The method of claim 1, wherein exposing the first polymer layer comprises grinding upper portions of the molding compound.

9. The method of claim 1, wherein forming the RDL comprises forming a metallic line portion over the first polymer layer, the metallic line portion having a lateral portion vertically overlapping the molding compound.

10. The method of claim 1, wherein the forming the sacrificial film layer comprises using a thermal or ultraviolet light release film, and wherein the removing the remaining portions of the sacrificial film layer comprises exposing the sacrificial film layer to heat or ultraviolet light.

11. The method of claim 1, wherein removing the upper portion of the sacrificial film layer comprises using a different process than removing the remaining portions of the sacrificial film layer.

12. The method of claim 11, wherein removing the upper portion of the sacrificial film layer comprises a grinding process, and wherein removing the remaining portions of the sacrificial film layer comprises a wet etch process.

13. A method for integrated circuit packaging comprising:
   forming a sacrificial layer over a top surface of a die, the die comprising:
   a substrate;
   an interconnect structure over the substrate;
   a metal pad at the top surface of the die and over the interconnect structure; and
   a first polymer layer over the metal pad, wherein the sacrificial layer is disposed over and extends through the first polymer layer;

forming a molding compound over the sacrificial layer and the die, wherein the sacrificial layer is disposed between the molding compound and the die, and wherein the molding compound extends along sidewalls of the die and covers a top surface of the sacrificial layer;

exposing the sacrificial layer by grinding the molding compound;

exposing the first polymer layer by planarizing a portion of the sacrificial layer disposed over the first polymer layer so that top surfaces of the sacrificial layer and the first polymer layer are substantially co-planar;

removing a portion of the sacrificial layer extending through the first polymer layer; and forming a redistribution layer (RDL) over the first polymer layer, a via portion of the RDL extending through the first polymer layer and an additional polymer layer disposed over the first polymer layer, wherein the RDL is electrically connected to the metal pad, and wherein the via portion of the RDL is wider at a bottom of the additional polymer layer than at a top of the first polymer layer.

14. The method of claim 13, wherein the additional polymer layer contacts the first polymer layer, and wherein forming the RDL comprises forming a metallic line having a lateral portion vertically overlapping the molding compound.

15. The method of claim 13, wherein the die further comprises:
   a second polymer layer over the metal pad; and
   a metal pillar in the second polymer layer connected to the metal pad, wherein the via portion of the RDL is electrically connected to the metal pad through the metal pillar.

16. A method for integrated circuit packaging comprising:
   forming a first polymer layer over a die, the die comprising a contact pad at a top surface;
   patterning a first opening in the first polymer layer to expose the contact pad;
   forming a sacrificial film layer over the first polymer layer, wherein the sacrificial film layer extends in the first opening;
   forming a molding compound over the sacrificial film layer and the die relative the top surface of the die, the molding compound extending along sidewalls of the die and covers the sacrificial film layer;
   exposing the first polymer layer by removing portions of the sacrificial film layer over the first polymer layer so that top surfaces of the sacrificial layer and the first polymer layer are substantially level;
   removing the sacrificial film layer to expose the contact pad;
   forming a second polymer layer over the first polymer layer;
   patterning the second polymer layer to form a second opening extending through the second polymer layer, the second opening being directly over the first opening; and
   forming a redistribution layer (RDL) over the die and electrically connected to the contact pad, wherein a via portion of the RDL extends through the first opening, the second opening, and contacts a top surface of the first polymer layer exposed by the second opening.

17. The method of claim 16, wherein exposing the first polymer layer comprises removing portions of the molding compound over the first polymer layer.

18. The method of claim 16 wherein forming the second polymer layer comprises forming a portion of the second polymer layer in the first opening, and wherein the method further comprises removing the portion of the second polymer layer in the first opening.

19. The method of claim 16, wherein exposing the contact pad by removing portions of the sacrificial film layer in the first opening comprises using an alkaline-based chemical as a strip chemical.

20. The method of claim 16, wherein exposing the contact pad by removing portions of the sacrificial film layer in the first opening comprises using n-methylpyrrolidone (NMP) as a strip chemical.

* * * * *